(12) United States Patent
Zhang

(10) Patent No.: US 7,420,371 B2
(45) Date of Patent: Sep. 2, 2008

(54) SLAB-SELECTIVE RF COIL FOR MR SYSTEM

(75) Inventor: Huiming Zhang, Palatine, IL (US)

(73) Assignee: ENH Research Institute, Evanston, IL (US)

( * ) Notice: Subject to any disclaimer, the term of this patent is extended or adjusted under 35 U.S.C. 154(b) by 0 days.

(21) Appl. No.: 11/619,258

(22) Filed: Jan. 3, 2007

(65) Prior Publication Data

US 2007/0152668 A1 Jul. 5, 2007

Related U.S. Application Data

(60) Provisional application No. 60/756,271, filed on Jan. 4, 2006.

(51) Int. Cl.
*G01V 3/00* (2006.01)
(52) U.S. Cl. .................................................. 324/318
(58) Field of Classification Search ......... 324/300–322; 333/219–235; 343/725–730, 741–744, 866–871, 343/893, 904–906; 600/410–435
See application file for complete search history.

(56) References Cited

U.S. PATENT DOCUMENTS

| | | | |
|---|---|---|---|
| 6,633,161 B1 * | 10/2003 | Vaughan, Jr. ................ 324/318 |
| 6,771,070 B2 | 8/2004 | Lee | |
| 6,806,713 B2 | 10/2004 | Wong | |
| 7,023,209 B2 * | 4/2006 | Zhang et al. ................ 324/318 |
| 7,088,104 B2 * | 8/2006 | Bottomley ................... 324/328 |
| 7,215,120 B2 * | 5/2007 | Vaughan ...................... 324/318 |
| 7,268,554 B2 * | 9/2007 | Vaughan ...................... 324/322 |
| 2005/0122115 A1 * | 6/2005 | Maguire et al. .............. 324/322 |

OTHER PUBLICATIONS

Xiaoliang Zhang et al, Microstrip RF Surface Coil Design for Extremely High-Field MRI and Spectroscopy, Magnetic Resonance in Medicine 46:443-450 (2001).

* cited by examiner

*Primary Examiner*—Brij B Shrivastav
*Assistant Examiner*—Dixomara Vargas
(74) *Attorney, Agent, or Firm*—Quarles & Brady LLP

(57) ABSTRACT

An RF coil includes two coil portions that are spaced apart to define a slab therebetween. Each coil portion is a microstrip transmission line formed as a loop wherein the microstrip includes a conductive strip disposed on one side of a dielectric material and a ground plane disposed on the other side of the dielectric material. When energized, a uniform RF field is produced in the slab. An array of such RF coils arranged back to back can be formed to allow for the selective excitation of a desired slab.

12 Claims, 6 Drawing Sheets

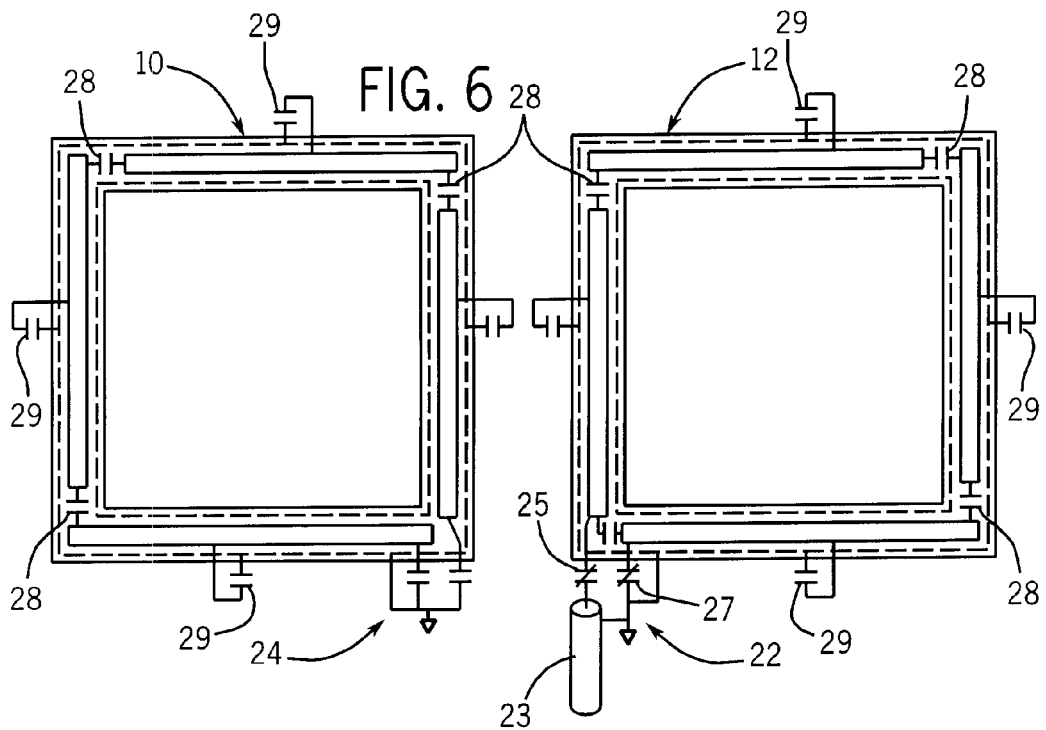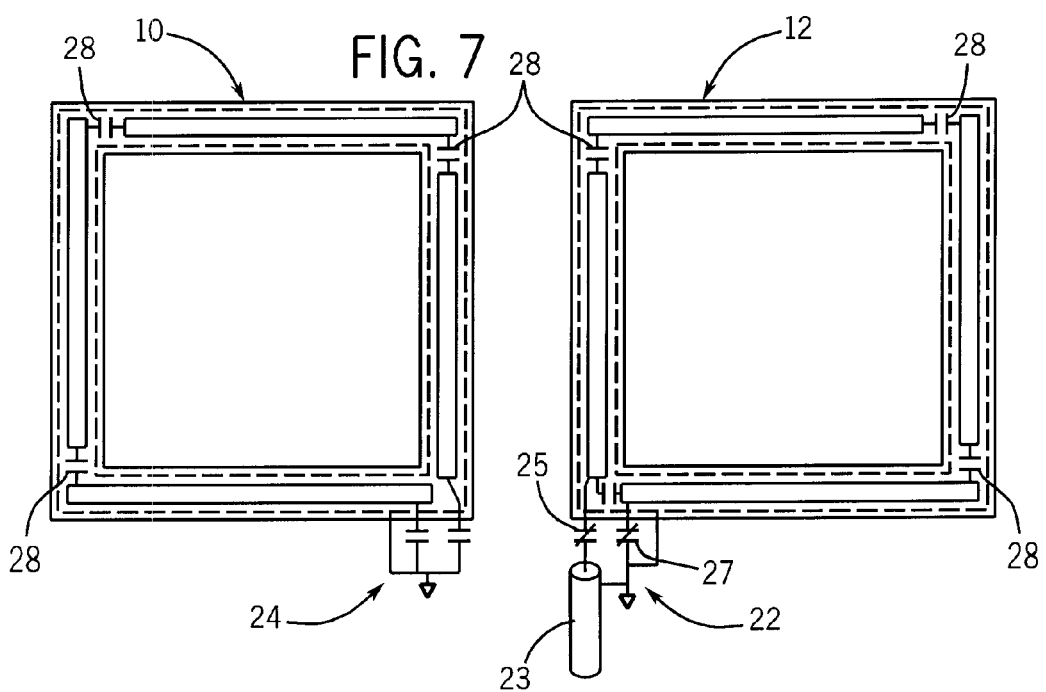

SLAB-SELECTIVE RF COIL FOR MR SYSTEM

CROSS REFERENCES TO RELATED APPLICATIONS

This application claims priority to U.S. provisional patent application Ser. No. 60/756,271, filed on Jan. 4, 2006, and titled "SLAB-SELECTIVE RF COIL FOR MR SYSTEM".

STATEMENT REGARDING FEDERALLY SPONSORED RESEARCH

This invention was made with government support under Grant No. EB002912 awarded by the National Institutes of Health. The United States Government has certain rights in this invention.

FIELD OF THE INVENTION

The field of the invention is Magnetic Resonance Imaging (MRI) and Magnetic Resonance Spectroscopy (MRS), and particularly RF coils for use in such systems.

BACKGROUND OF THE INVENTION

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a radio frequency (RF) magnetic field (excitation field $B_1$) which is in the x-y plane and which is near the Larmor frequency, the net aligned moment may be rotated, or "tipped", into the x-y plane to produce a net transverse magnetic moment. A signal is emitted by the excited spins after the excitation signal $B_1$ is terminated, this signal may be received and processed to form an image (MRI) or produce a spectrum (MRS).

Radio frequency antennas or coils are used to produce the excitation field $B_1$ and other RF magnetic fields in the subject being examined. Such coils are also used to receive the very weak NMR signals that are produced in the subject. Various types of coils are known, including large, whole-body RF coils which are built in to the MR system and produce a uniform RF field throughout a large region. Even though MR data may be acquired only from a small volume or slice in a subject placed in the MR system bore, the RF field from a whole-body RF coil permeates throughout the subject. The advantage of the whole-body coil is that the region of interest being imaged can be shifted to any location in the patient by changing the pulse sequence. Other known coils include various types of smaller "local" coils that are designed for specific clinical applications such as head imaging, knee imaging, wrist imaging, etc. Local coils may be either volume coils or surface coils. While local coils do limit the region that is subject to RF excitation fields during a scan, the shape and homogeneity of their fields is often not appropriate for a particular application.

The most common whole body coil found in commercial MRI systems is the so-called "birdcage" coil first disclosed in U.S. Pat. Nos. 4,692,705; 4,694,255; and 4,680,548. A birdcage coil has a pair of circular end rings which are bridged by a plurality (typically 8 to 24) of equi-spaced longitudinal straight segments. In a primary mode, currents in the straight segments are sinusoidally distributed which results in good $B_1$ field uniformity across the axis of the coil. Birdcage coils are the structure of choice in horizontal field MRI systems because they produce a homogeneous magnetic field in the bore of the magnet and they have a high SNR which enables them to pick up the small NMR signals emanating from the examined subject.

An issue with all RF coils used to generate the $B_1$ field is the level of electromagnetic energy which can be absorbed by a human subject during a scan. The FDA has imposed limits on such Specific Absorption Rate (SAR). Some pulse sequences employ RF excitation pulses of long duration which may expose the subject to excessive RF radiation. This is particularly problematic at high polarizing magnetic field strengths where SAR limits are easily exceeded. In these applications it is particularly desirable to limit the RF radiation as much as possible to the region of interest from which MR data is to be acquired.

There are a number of clinical applications where MR images are acquired at different Larmor frequencies. Hydrogen ($^1H$) is the spin species of choice for most MR imaging applications, but other paramagnetic spin species such as phosphorus ($^{31}P$), fluorine ($^{19}F$), carbon ($^{13}C$), sodium ($^{23}Na$), helium ($^3He$) and xenon ($^{129}Xe$) are also of interest.

SUMMARY OF THE INVENTION

The present invention is an RF coil for a magnetic resonance system which produces a uniform RF magnetic field in a well defined slab through the subject. Such a slab can be made fairly thin, on the order of a few centimeters for example. MR data may be acquired from such a slab using higher amplitude and duration RF excitation pulses without exposing the subject to significant RF radiation outside the slab.

In one embodiment, the RF coil includes two parallel coil portions each comprised of a loop-shaped conductor strip disposed on one surface of a dielectric material and a loop-shaped conductive ground plane disposed on an opposite surface. The coil portions are spaced apart to define the slab to be irradiated in the space between them.

A general object of the invention is to provide an RF coil that has high sensitivity, high field homogeneity, and high power efficiency free from the effect of dielectric resonance at high magnetic fields ($B_0 > 3T$), for delivering RF power and for detecting NMR RF signals. The RF coil of the present invention has the shape and size of a volume coil, but the volume is very thin such that a slab through the subject may be examined without exceeding SAR.

Another object of the invention is to produce a slab of RF excitation that can be produced at any location in a subject. The RF coil can be moved to different positions, or a plurality of RF coils made according to the present invention can be concatenated such that the slabs they excite are substantially continuous from one to the next. Different regions in the subject can be selectively irradiated during an MR pulse sequence by activating any one or more of the separate RF coils.

Yet another object of the invention is to provide an RF coil that may be used in MR systems with low or high polarizing magnetic field strengths. This can be achieved by segmenting the conductive elements of the coil.

BRIEF DESCRIPTION OF THE DRAWINGS

FIGS. 5-7 are pictorial and schematic views of three electrical circuits coupled to the RF coil of FIG. 1;

DETAILED DESCRIPTION OF THE PREFERRED EMBODIMENT

Figure 11:
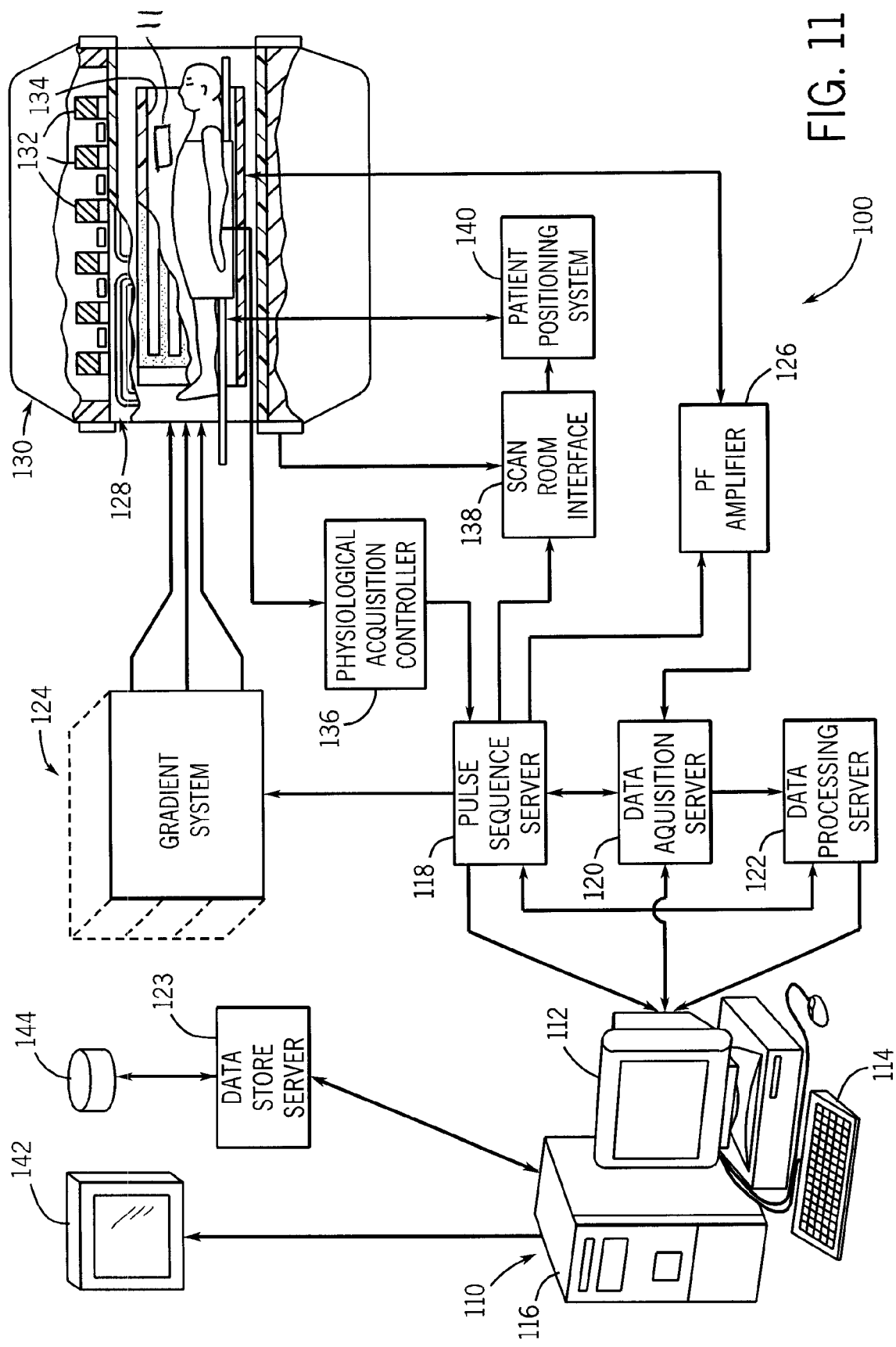
FIG. 11 is a block diagram of an MRI system which employs the RF coil of the present invention.

Referring particularly to FIG. 11, an RF coil 11 according to the invention is employed in an MRI system such as MRI system 100, which includes a workstation 110 having a display 112 and a keyboard 114. The workstation 110 includes a processor 116 and provides the operator interface which enables scan prescriptions to be entered into the MRI system.

The workstation 110 is coupled to four servers: a pulse sequence server 118, a data acquisition server 120, a data processing server 122, and a data store server 123. The data store server 123 is for example performed by the workstation processor 116 and associated disc drive interface circuitry. The remaining three servers 118, 120 and 122 can be performed by separate processors mounted in a single enclosure and interconnected using a 64-bit backplane bus. The pulse sequence server 118 can employ a commercially available microprocessor and a commercially available quad communication controller. The data acquisition server 120 and data processing server 122 can both employ the same commercially available microprocessor and the data processing server 122 further includes one or more array processors based on commercially available parallel vector processors.

The workstation 110 and each processor for the servers 118, 120 and 122 are connected to a serial communications network. This serial network conveys data that is downloaded to the servers 118, 120 and 122 from the workstation 110 and it conveys tag data that is communicated between the servers and between the workstation and the servers. In addition, a high speed data link is provided between the data processing server 122 and the workstation 110 in order to convey image data to the data store server 123.

The pulse sequence server 118 functions in response to program elements downloaded from the workstation 110 to operate a gradient system 124 and an RF system 126. Gradient waveforms necessary to perform the prescribed scan are produced and applied to the gradient system 124 which excites gradient coils in an assembly 128 to produce the magnetic field gradients Gx, Gy and Gz used for position encoding NMR signals. The gradient coil assembly 128 forms part of a magnet assembly 130 which includes a polarizing magnet 132 and a whole-body RF coil 134, and/or RF coil 11 made in accordance with the teachings of the present invention.

The RF system 126 includes an RF transmitter for producing a wide variety of RF pulses used in MR pulse sequences. The RF system 126 also includes one or more RF receiver channels. RF excitation waveforms are applied by the RF system 126 to perform the prescribed magnetic resonance pulse sequence. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to the RF coil 11. Responsive NMR signals detected by the whole body RF coil 134 or the RF coil 11 are received by the RF system 126, amplified, demodulated, filtered and digitized under direction of commands produced by the pulse sequence server 118. Each RF receiver channel includes an RF amplifier that amplifies the NMR signal received by the RF coil to which it is connected and a quadrature detector which detects and digitizes the I and Q quadrature components of the received NMR signal. The magnitude of the received NMR signal may thus be determined at any sampled point by the square root of the sum of the squares of the I and Q components, and the phase of the received NMR signal may also be determined in a conventional manner.

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 which receives signals from various sensors associated with the condition of the patient and the magnet system. It is also through the scan room interface circuit 138 that a patient positioning system 140 receives commands to move the patient to desired positions during the scan.

It should be apparent that the pulse sequence server 118 performs real-time control of MRI system elements during a scan. As a result, it is necessary that its hardware elements be operated with program instructions that are executed in a timely manner by run-time programs. The description components for a scan prescription are downloaded from the workstation 110 in the form of objects. The pulse sequence server 118 contains programs which receive these objects and converts them to objects that are employed by the run-time programs.

The digitized NMR signal samples produced by the RF system 126 are received by the data acquisition server 120. The data acquisition server 120 operates in response to description components downloaded from the workstation 110 to receive the real-time NMR data and provide buffer storage such that no data is lost by data overrun. In some scans the data acquisition server 120 does little more than pass the acquired NMR data to the data processor server 122. However, in scans which require information derived from acquired NMR data to control the further performance of the scan, the data acquisition server 120 is programmed to produce such information and convey it to the pulse sequence server 118. For example, during prescans NMR data is acquired and used to calibrate the pulse sequence performed by the pulse sequence server 118.

The data processing server 122 receives NMR data from the data acquisition server 120 and processes it in accordance with description components downloaded from the workstation 110. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 which is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 10.

Figure 3:
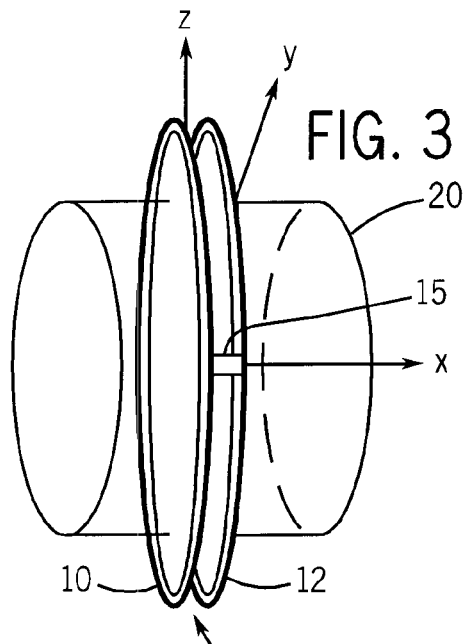
FIG. 3 is a pictorial representation of an alternative embodiment of the RF coil.
Figure 4:
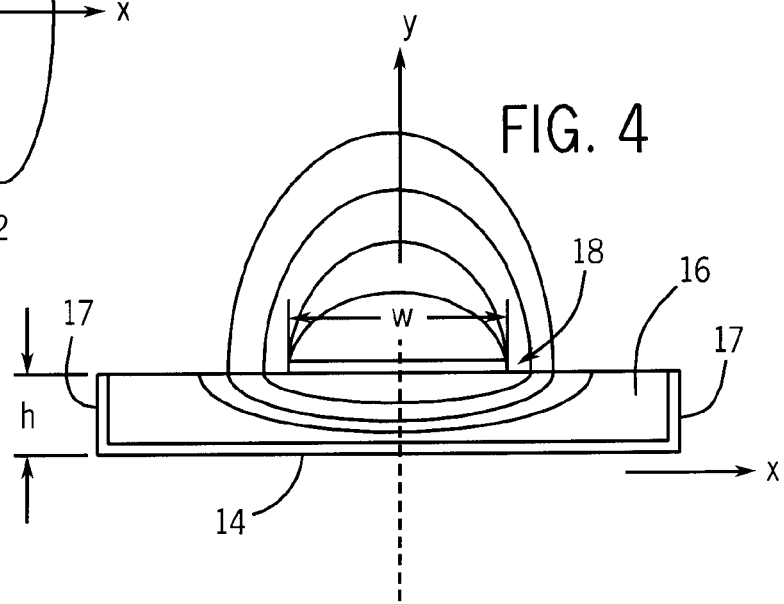
FIG. 4 is a view in cross-section through one coil portion of the RF coil in FIG. 1.

Referring to FIGS. 1-5, the slab selective RF coil 11 includes two coil halves or portions 10 and 12 which are parallel to each other and spaced apart to define a slab therebetween. Each coil portion 10 and 12 is a microstrip transmission line formed as a loop and which includes a conductive ground plane 14 formed on one surface of a dielectric material 16, and a conductive strip 18 formed on the other surface of the dielectric material 16. The conductive strip 18 of the coil portion 10 is arranged to face the conductive strip 18 of the coil portion 12. The conductive strip 18 may extend over the entire outer surface of the material 16 and further extend over sidewalls 17 such as shown in FIG. 4.

Figure 1:
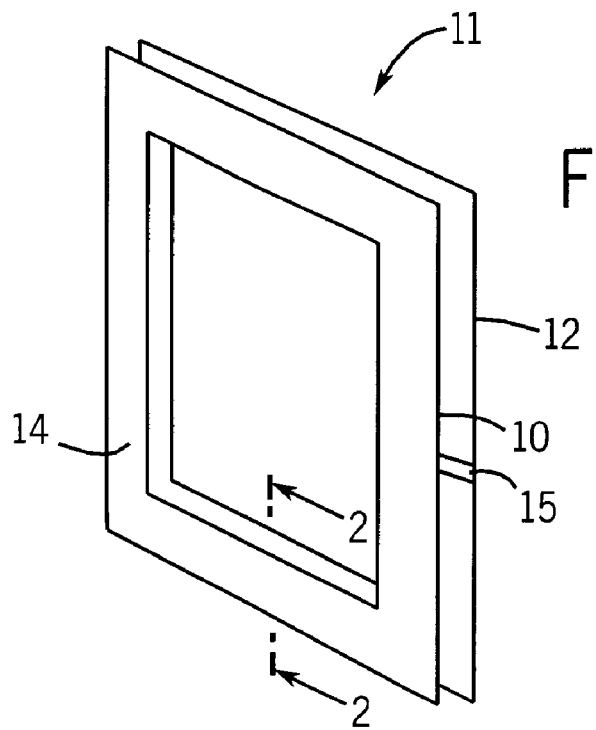
FIG. 1 is a perspective view of a preferred RF coil according to the present invention.
Figure 2:
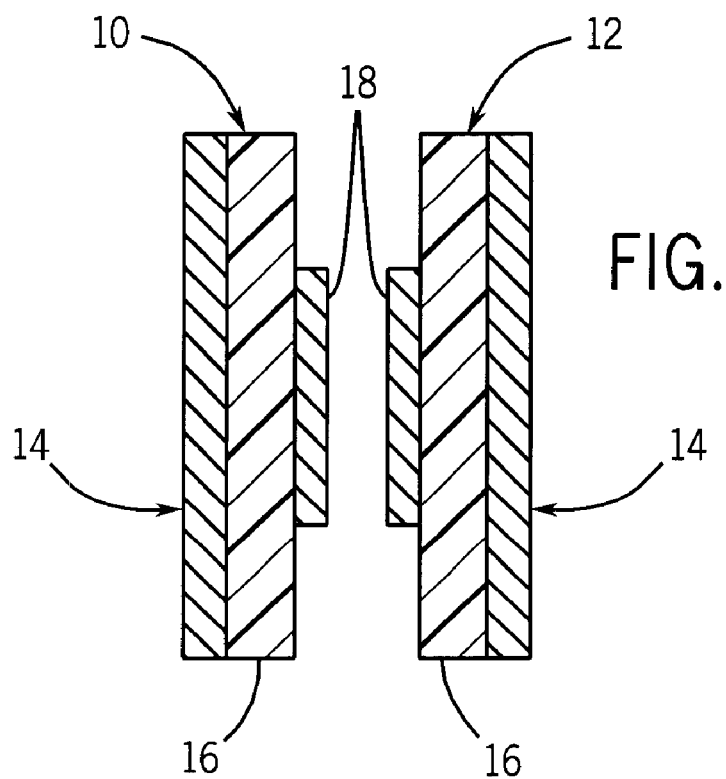
FIG. 2 is a view in cross-section taken through the plane 2-2 indicated in FIG. 1.

In the embodiment illustrated in FIG. 1, each loop can be square in shape, but the loops can also take other shapes such as circles as shown in FIG. 3, ovals, or ellipses (not shown). Support structure 15 such as one or more plastic strips on or near an outer periphery of the RF coil 11 can be used to fix the two coil portions 10 and 12 together and control the distance between them. The size and shape of the coil portions 10 and 12 are such that the coil encircles the subject 20 to be imaged. The subject could be an arm or leg in which case the coil portions are smaller local coils, or the coil portions could be formed as a whole-body coil to fully encircle a patient.

The dielectric material 16 may take the form of a dielectric substrate such as low loss dielectric sheets like Teflon or acrylic, or may be air, a vacuum, liquid helium, or liquid nitrogen, and may require additional substrate material to enclose such material and support the conductor strip and the ground plane.

As described below, the coil portions 10 and 12 are inductively coupled to one another when driven. Depending on the distance between these portions, so called "over-coupling" between the portions will occur. Such coupling generates two resonance modes, so that one of the modes can be tuned to a desired Larmor frequency.

FIG. 4 illustrates the magnetic field lines responsible for the RF field for a single microstrip transmission line portion 10 or 12. The spatial distribution of the magnetic field depends on structural parameters of the coil portion 10 or 12 such as the width w of the conductive strip and the thickness h of the material 16, which will affect the characteristic impedance and the propagation velocity. The portion 10 or 12 will resonate at the half wavelength condition according to:

$$f = \frac{c}{2L\sqrt{\varepsilon_{eff}}} \quad (1)$$

where f is the fundamental resonant frequency, c is the speed of light in free space, L is the physical length of the loop, and $\varepsilon_{eff}$ is the effective dielectric constant of the substrate, expressed as $$\varepsilon_{eff} = \frac{\varepsilon_r + 1}{2} + \frac{\varepsilon_r - 1}{2\sqrt{1 + 12h/w}} \quad (2)$$

where $\varepsilon_r$ is the relative dielectric constant or permittivity of the material 16. A dielectric material with $\varepsilon_r$ approximately equal to 2 is suitable for the fabrication of RF coil 11 used in MR systems with polarizing magnetic field strengths of 4.7-9.4 T. The maximum Q-factor of such a coil is a function of the relative dielectric constant and substrate thickness h for a given resonant frequency.

Figure 5:
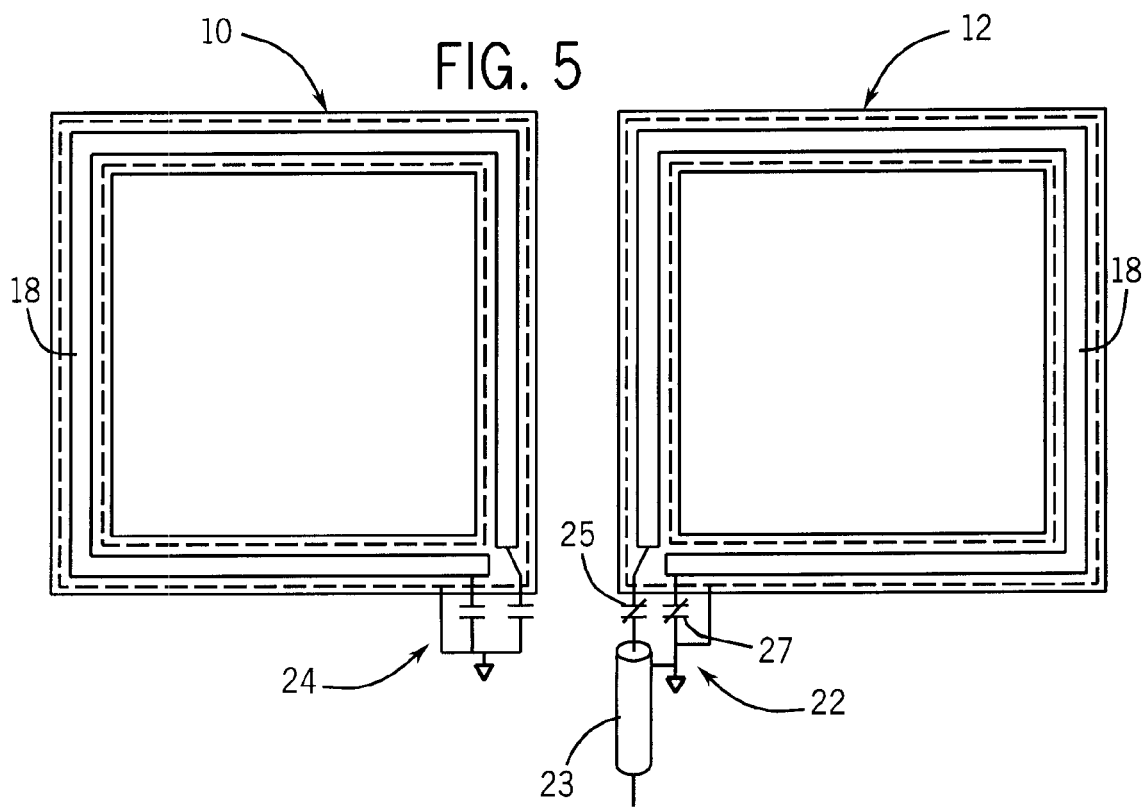

Equation 1 indicates that the physical length of the conductive strip of the coil portion 10 or 12 is limited by the relative dielectric constant of the substrate, the desired resonant frequency, and the physical dimensions h and w of the coil portion. However, there are several ways to get around this "half wavelength" constraint. For example, the actual length of the conductive strip can be less than the half wavelength by the addition of ground capacitors at the end of the loop, such as shown in FIG. 5, or by the use of segmented strips and distributed capacitors, such as shown in FIGS. 6 and 7. The segmented strips are advantageous in that by adjusting the capacitors and the strip lengths of the segments, coils of various sizes can be built to be operable at various magnetic field strengths.

The embodiment shown in FIG. 1 can be constructed for proton MR imaging at 4.7 T, corresponding to a Larmor resonance frequency of 200 MHz. For such a case, a loop size of approximately 7×7 cm² measured in the middle provides satisfactory operation. In one embodiment, the conductive strips 18 and ground planes 14 are made from 36 μm-thick copper foils with 54 μm-thick acrylic adhesive from Saint-Gobain Performance Plastics Corporation (Hoosick, N.Y.). The width W of the conductive strip 18 is ¼" (6.35 mm), and the width of the ground plane 14 is ½" (12.7 mm). The dielectric material 16 is an acrylic sheet (polymethyl methacrylate) from United State Plastic Corporation (Lima, Ohio) with a relative dielectric constant of 2.7. The thickness of the sheet can be for example ⅛" (3.2 mm), ¼" (6.35 mm) or ½" (12.7 mm). A desirable spacing between the coil portions, or slab thickness, is in the range of 1.5 cm to 2.5 cm.

In another embodiment, the circular loop RF coil 11 shown in FIG. 3 can be formed with a diameter of 12 cm, and constructed using Virgin Teflon (PTFE) as a dielectric substrate to reduce the dielectric loss, with a relative dielectric constant of around 2.1 and a loss tangent of 0.00001. A desirable thickness of the dielectric substrate is in the range of 3 mm to 15 mm.

Various examples of the electrical circuitry to couple the RF coil 11 to an MR system are shown in FIGS. 5-7. In all cases one coil portion 12 is driven through a capacitive coupling circuit 22 and the other coil portion 10 is inductively coupled to the driven coil portion 12. Capacitive coupling network 22 is connected to coaxial cable 23 which can be directly driven by RF system 126. The variable capacitor 25 which connects the coaxial cable 23 and conductive strip 18 is for matching, and the variable capacitor 27 is for tuning. The coil portion 10 is tuned by coupling circuit 24 connecting the ends of the conductive strip 18 to circuit ground. The ground planes 14 in each coil portion 10 and 12 are also connected to circuit ground.

For the non-segmented RF coil illustrated in FIG. 5, non-magnetic trimmer capacitors JMC5641 from Johanson Manufacturing Corp. (Booton, N.J.) are used in the driving circuit 22, one for tuning and one for matching as described above. Non-magnetic chip capacitors ATC 100B series from American Technique Ceramics Corporation (Huntington Station, N.Y.) are used in the coupling circuit 24 for grounding, one 5.6 pf capacitor is used for one end and one 6.8 pf capacitor is used for the other end.

For the segmented RF coils as shown in FIGS. 6 and 7, non-magnetic chip capacitors ATC 100B are used for the distributed capacitors 28. The typical value for the capacitors 28 connected between the conductive strips is 18-22 pf, and the typical value for the capacitors 29 used for the distributed grounding as shown in FIG. 6 is 10 pf.

The two coil portions 10 and 12 are placed symmetrically about the center plane of a slab to be radiated with RF energy. Two resonance peaks result from the coupling and the lower peak is tuned to 200 MHz for a 4.7 T MR system for proton imaging, or to another desired Larmor frequency.

Figure 8:
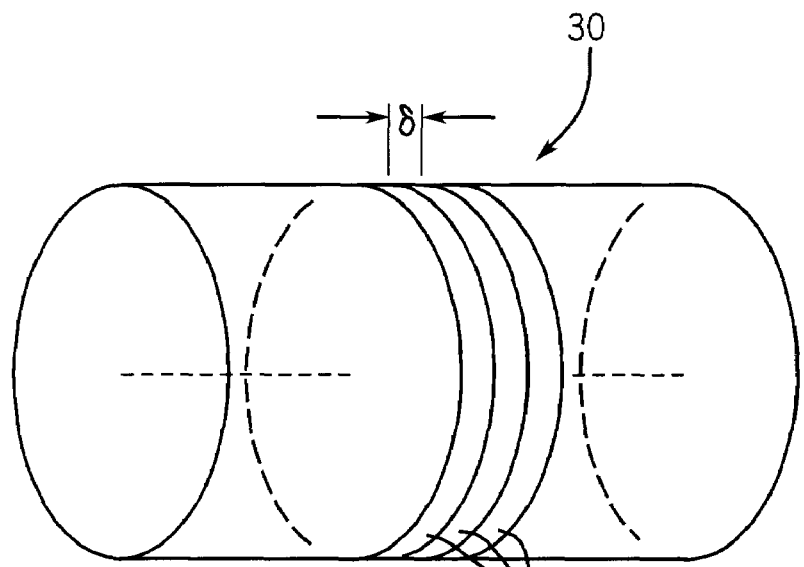
FIG. 8 is a schematic view of a coil array including a plurality of concatenated coils such as the coil illustrated in FIG. 3.

As illustrated in FIG. 8, a plurality of RF coils 11 such as the ones illustrated in FIG. 1 or 3 can be concatenated to form a coil array 30 such that the slabs δ that can be excited are substantially continuous from one to the next. Different regions in the subject can be selectively irradiated during an MR pulse sequence by activating any one or more of the separate RF coils. Switching between the separate coils can be achieved for example, using circuitry similar to that used for phased array coils in parallel imaging MR systems.

Figure 9A:
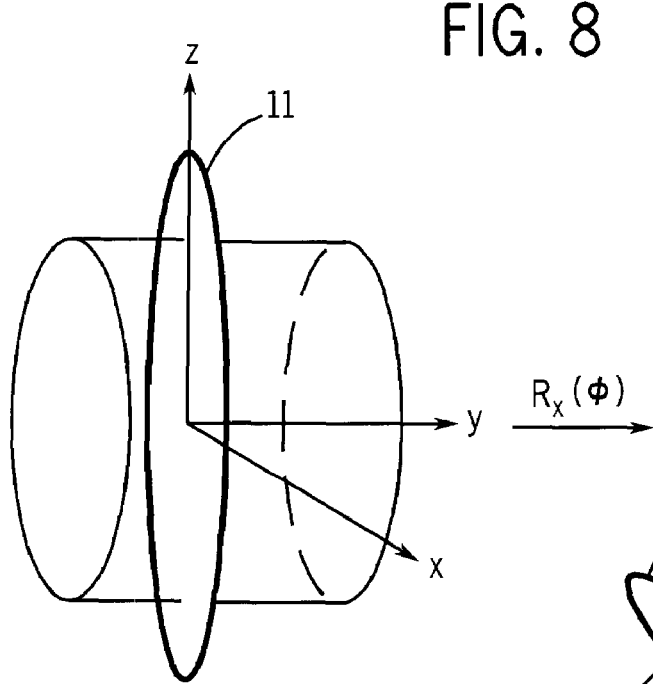
FIGS. 9(a) and 9(b) are examples of possible orientations of the slab selective RF coil in an MR system.
Figure 9B:
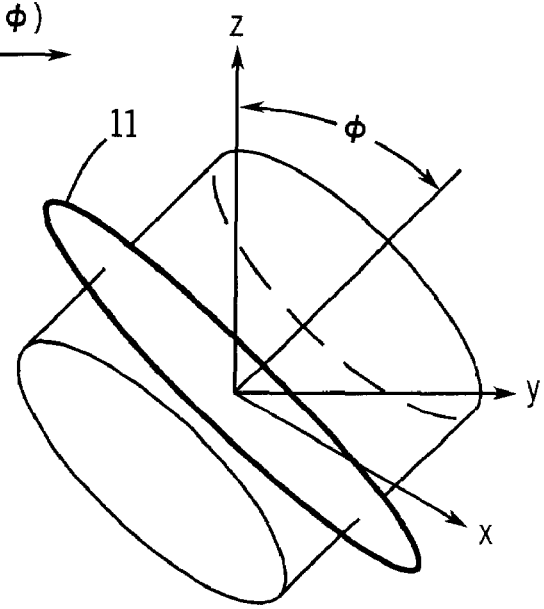

Depending on the size of such a coil array or an individual coil, and what is to be imaged, different orientations of the coil array or coil with respect to the z axis (polarizing magnetic field) in an MR system are possible, such as is shown in FIGS. 9(a) and 9(b). The maximum RF amplitude $B_1$ is located in the region near the loop plane (y~0). In order to accommodate a subject to be imaged, the RF coil 11 can be rotated from a position such as shown in FIG. 9(a) to an angle φ representing the orientation of the coil normal with respect to the static magnetic field z-axis. The RF amplitude $B_1$ for the loop depends on the angle φ according to:

$$B_1(\phi) = B_{max} \sin \phi \qquad (3)$$

where $B_{max}$ is the RF amplitude at φ=90 degrees.

Figure 10A:
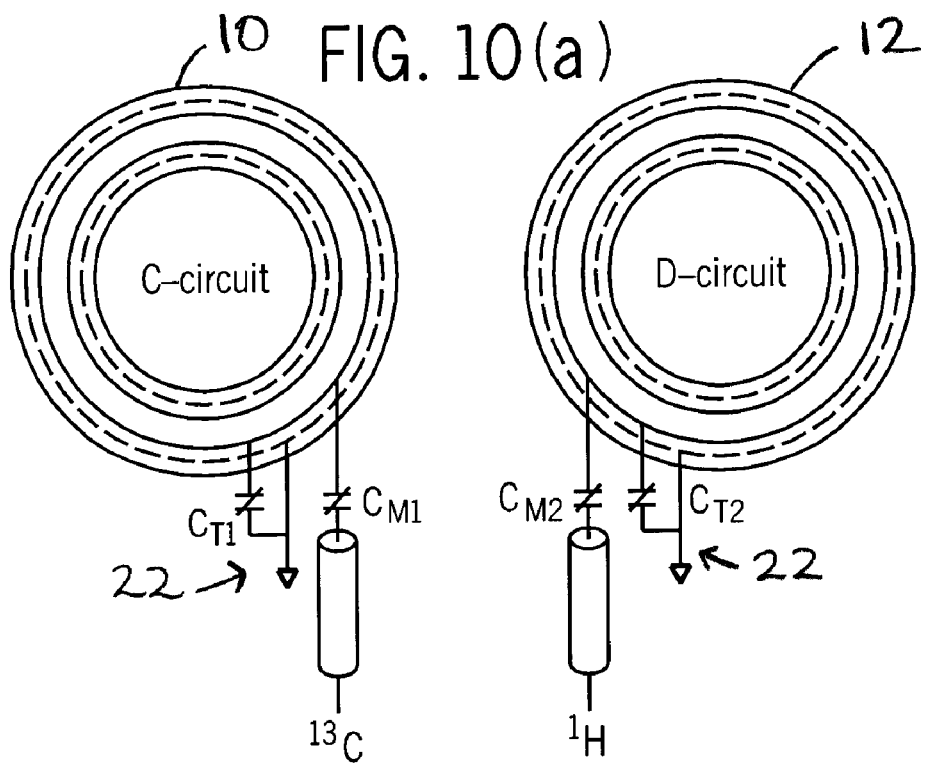
FIGS. 10(a)-(b) are pictorial and schematic views of electrical circuitry coupled to the RF coil of FIG. 3 for double resonance operation.
Figure 10B:
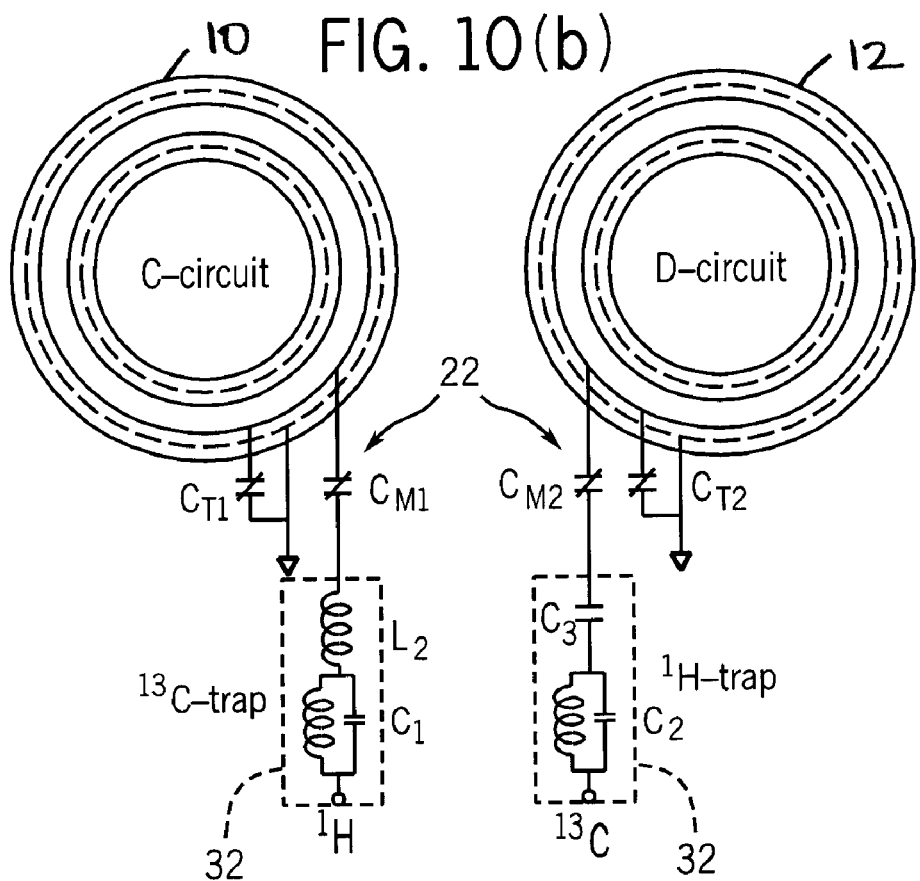

FIGS. 10(a) and (b) illustrates electrical circuitry associated with an RF coil 11 according to the present invention wherein RF coil 11 is operable as a double resonance slab selective coil for imaging two different nuclear species, such as $^1H$ and $^{13}C$. For example, a 12 cm diameter (L=37 cm) circular coil having symmetric coil portions 10 and 12, with a spacing there between of d=2 cm provides a coil operable at two frequencies. As shown in FIG. 10(a), each coil portion 10, 12 is separately connected to a T/R channel in an MR system, and each can use circuitry similar to that circuitry 22 as shown in FIGS. 5-7 for tuning and matching. In particular, capacitors $C_{M1}$ and $C_{M2}$ are adjusted to provide impedance matching, and the ground capacitor $C_{T1}$ can be adjusted to tune coil portion 10, and capacitor $C_{T2}$ can be adjusted to tune coil portion 12 in a manner that one resonance mode is slightly higher in frequency than the $^{13}C$ frequency and the other resonance mode is slightly lower than the $^1H$ frequency. It is expected that the mutual inductance induced by the strong coupling will move the $^1H$ frequency to a higher frequency and the $^{13}C$ frequency to a lower frequency. Both loops can be driven at the same time. In order to remove the interference between the two channels, RF traps 32 such as those shown in FIG. 10(b) may also be utilized.

The present invention has been described in terms of one or more preferred embodiments, and it should be appreciated that many equivalents, alternatives, variations, and modifications, aside from those expressly stated, are possible and within the scope of the invention. Therefore, the invention should not be limited to a particular described embodiment.

What is claimed is:

1. An RF coil for a magnetic resonance system, comprising:
   a first microstrip coil portion formed as a loop and having a conductive strip disposed on one side of a first dielectric material and a conductive ground plane disposed on an opposite side of the first dielectric material;
   a second microstrip coil portion formed as a loop of substantially the same size and shape as the loop defined by the first microstrip coil portion and having a conductive strip disposed on one side of a second dielectric material and a conductive ground plane disposed on an opposite side of the second dielectric material; and
   support structure for maintaining the first and second coil portions in spaced parallel relation to each other with their respective conductive strips facing each other and defining an excitation slab therebetween.

2. The RF coil as recited in claim 1 wherein the dielectric material is formed as a dielectric substrate.

3. The RF coil as recited in claim 1 wherein one of the coil portions is connectable to an RE source and the other coil portion is inductively coupled to the one coil portion.

4. The RE coil as recited in claim 1 wherein the conductive strip of at least one of the first microstrip coil portion and the second microstrip coil portion is segmented.

5. The RE coil as recited in claim 1 wherein the conductive strips of both the first and second microstrip coil portions are segmented.

6. The RF coil as recited in claim 1 wherein the conductive strip of at least one of the first microstrip coil portion and the second microstrip coil portion is formed as a continuous loop.

7. The RF coil as recited in claim 1 wherein the conductive strips of both the first and second microstrip coil portions are formed as a continuous loop.

8. The RE coil as recited in claim 1 further including means for tuning at least one of the coil portions to a desired Larmor frequency.

9. The RE coil as recited in claim 8 wherein the means for tuning includes a capacitor.

10. The RE coil as recited in claim 1 further including means for tuning each coil portion to a respective desired Larmor frequency.

11. The RF coil as recited in claim 10 wherein the means for tuning includes respective capacitors.

12. An RF coil array comprising a plurality of RE coils stacked together, each RE coil including a first microstrip coil portion formed as a loop and having a conductive strip disposed on one side of a first dielectric material and a conductive ground plane disposed on an opposite side of the first dielectric material, a second microstrip coil portion formed as a loop of substantially the same size and shape as the loop defined by the first microstrip coil portion and having a conductive strip disposed on one side of a second dielectric material and a conductive ground plane disposed on an opposite side of the second dielectric material, and support structure for maintaining the first and second coil portions in spaced parallel relation to each other with their respective conductive strips facing each other and defining an excitation slab therebetween, and wherein a desired individual slab of the plurality of excitation slabs is selectively excitable.

* * * * *